(12) United States Patent
Zhou et al.

(10) Patent No.: US 11,417,719 B2
(45) Date of Patent: Aug. 16, 2022

(54) ORGANIC LIGHT-EMITTING DIODE DISPLAY PANEL WITH ANODE LAYER ON SIGNAL TRACE IN NON-DISPLAY AREA

(71) Applicant: WUHAN CHINA STAR OPTOELECTRONICS SEMICONDUCTOR DISPLAY TECHNOLOGY CO., LTD., Hubei (CN)

(72) Inventors: Sisi Zhou, Hubei (CN); Shaojing Wu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 235 days.

(21) Appl. No.: 16/770,598

(22) PCT Filed: Feb. 18, 2020

(86) PCT No.: PCT/CN2020/075676
§ 371 (c)(1),
(2) Date: Jun. 6, 2020

(87) PCT Pub. No.: WO2021/114475
PCT Pub. Date: Jun. 17, 2021

(65) Prior Publication Data
US 2022/0005911 A1 Jan. 6, 2022

(30) Foreign Application Priority Data
Dec. 10, 2019 (CN) .......................... 201911256637.6

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01); *H01L 27/3246* (2013.01); *H01L 27/3258* (2013.01)

(58) Field of Classification Search
CPC ............ H01L 27/3276; H01L 27/3246; H01L 27/3258; H01L 51/5253
See application file for complete search history.

(56) References Cited

U.S. PATENT DOCUMENTS

2015/0380474 A1* 12/2015 Lee ..................... H01L 51/5262
257/40
2018/0159074 A1* 6/2018 Kim .................... H01L 27/3248
(Continued)

FOREIGN PATENT DOCUMENTS

CN 107819013 A 3/2018
CN 108962947 A 12/2018

*Primary Examiner* — Lex H Malsawma
(74) *Attorney, Agent, or Firm* — Dickinson Wright PLLC

(57) ABSTRACT

The present disclosure provides an organic light-emitting diode (OLED) display panel comprising a display area, a non-display, and a block area provided in the non-display area. The OLED display panel includes a signal trace layer, an organic film layer, and an anode layer which are sequentially located on the signal trace layer. The signal trace layer is provided with a signal trace in the non-display area. When an anode is formed on the anode layer, an anode material layer at least covering the exposed signal trace is formed in the corresponding block area, so as prevent mis-etching of the signal trace caused by the etching solution.

18 Claims, 2 Drawing Sheets

(56) References Cited

U.S. PATENT DOCUMENTS

2019/0148419 A1     5/2019  Song et al.
2020/0006697 A1*    1/2020  Jung .................... H01L 27/3246
2020/0212114 A1*    7/2020  Song .................... H01L 27/323
2020/0235333 A1*    7/2020  Sung .................... G06F 1/1686

* cited by examiner

ORGANIC LIGHT-EMITTING DIODE DISPLAY PANEL WITH ANODE LAYER ON SIGNAL TRACE IN NON-DISPLAY AREA

This application claims the priority of Chinese Application No. 201911256637.6, filed on Dec. 10, 2019, entitled "ORGANIC LIGHT-EMITTING DIODE DISPLAY PANEL". The entire disclosures of each of the above applications are incorporated herein by reference.

FIELD OF INVENTION

The present disclosure relates to the technical field of display, and in particular, relates to an organic light-emitting diode display panel.

BACKGROUND OF INVENTION

In a flexible organic light-emitting diode (OLED) display panel, the VDD trace is generally made of Ti/Al/Ti metal. Usually, when blocks are disposed in a non-display area of the OLED display panel, an organic layer on the VDD trace adjacent to two lateral sides of the area, where the block is to be formed, needs to be excavated to form blocks. The VDD trace is exposed during the process of the forming the blocks. During subsequent etching of the electrode layer (anode), the etching solution may infiltrate along the edges of the VDD (Ti/Al/Ti) trace and etch Al, which forms cavities in the middle and affects the encapsulation effect.

Therefore, the prior art has defects and urgently needs improvement.

SUMMARY OF INVENTION

Technical Problem

The present disclosure provides an organic light-emitting diode display panel, which can solve the problem of mis-etching of the exposed signal trace caused by the etching solution during formation of the anode.

Technical Solution

To solve the above problems, the technical solutions provided in the present disclosure are as follows:

The present disclosure provides an organic light-emitting diode display panel comprising a display area, a non-display area located around the display area, and a block area provided in the non-display area;

wherein the organic light-emitting diode display panel comprises a signal trace layer, an organic film layer formed on the signal trace layer, and an anode layer formed on the organic film layer;

wherein the signal trace layer is provided with a signal trace in the non-display area, and the signal trace passes through the block area and extends to the non-display area located at opposite sides of the block area;

wherein a portion of the organic film layer corresponding to the block area is patterned to form at least one block, and a space between adjacent two blocks and a space between the block and the organic film layer outside the block area are formed by grooves;

wherein the grooves pass through the organic film layer partially or completely, and the anode layer is at least formed on a side of an exposed portion of the signal trace corresponding to the grooves when all the grooves pass through the organic film layer.

In the organic light-emitting diode display panel of the present disclosure, the organic light-emitting diode display panel further comprises a organic light-emitting layer formed on the anode layer, a cathode layer, and a thin film encapsulation layer; the thin film encapsulation layer includes an inorganic encapsulation layer and an organic encapsulation layer that are arranged in a stack; a boundary of the organic encapsulation layer abuts against the block area; and a boundary of the inorganic encapsulation layer is located in the non-display display area adjacent to a side of the block area away from the display area.

In the organic light-emitting diode display panel of the present disclosure, the block area includes the blocks and the grooves located at two lateral sides of blocks; a portion of the anode layer corresponding to the block area and a portion of the anode layer corresponding to the display area are in a disconnected state at a position of the non-display area between the block area and the display area, so that the anode layer forms an anode corresponding to the display area and an anode material layer corresponding to the block area.

In the organic light-emitting diode display panel of the present disclosure, the anode material layer is formed in the groves located at two lateral sides of the blocks, and the anode material layer at least covers the exposed portion of the signal trace.

In the organic light-emitting diode display panel of the present disclosure, the grooves are ring shapes surrounding the display area, and the anode material layer covers an upper surface and a side surface of the signal trace.

In the organic light-emitting diode display panel of the present disclosure, the anode material layer is formed on a bottom and side wall of the grooves.

In the organic light-emitting diode display panel of the present disclosure, the anode material layer forms a continuous film in the block area, and the anode material layer extends from a boundary of the block area near a side of the display area to a boundary of the block area away from the display area.

In the organic light-emitting diode display panel of the present disclosure, a boundary of the anode material layer is located in the non-display display area adjacent to a side of the block area away from the display area, and an orthographic projection of the thin film encapsulation layer located on the organic light-emitting diode display panel covers an orthographic projection of the anode material layer located on the organic light-emitting diode display panel.

In the organic light-emitting diode display panel of the present disclosure, the signal trace includes a source/drain pole and the signal trace disposed on the same layer as the source/drain pole, and the material of the signal trace is the same as the material of the source/drain pole.

The present disclosure provides an organic light-emitting diode display panel comprising a display area, a non-display area located around the display area, and a block area provided in the non-display area;

wherein the organic light-emitting diode display panel comprises a signal trace layer, an inorganic film layer formed on the signal trace layer, an organic film layer formed on the inorganic film layer, and an anode layer formed on the organic film layer;

wherein the signal trace layer is provided with a signal trace in the non-display area, and the signal trace passes through the block area and extends to the non-display area located at opposite sides of the block area;

wherein a portion of the organic film layer corresponding to the block area is patterned to form at least one block, and a space between adjacent two blocks and a space between the block and the organic film layer outside the block area are formed by grooves;

wherein the grooves pass through the organic film layer and the inorganic film layer partially or completely, and the anode layer is formed on a side of an exposed portion of the signal trace corresponding to the grooves when all the grooves pass through the organic film layer.

In the organic light-emitting diode display panel of the present disclosure, the organic light-emitting diode display panel further comprises a organic light-emitting layer formed on the anode layer, a cathode layer, and a thin film encapsulation layer; the thin film encapsulation layer includes an inorganic encapsulation layer and an organic encapsulation layer that are arranged in a stack; a boundary of the organic encapsulation layer abuts against the block area; and a boundary of the inorganic encapsulation layer is located in the non-display display area adjacent to a side of the block area away from the display area.

In the organic light-emitting diode display panel of the present disclosure, the block area includes the blocks and the grooves located at two lateral sides of blocks; a portion of the anode layer corresponding to the block area and a portion of the anode layer corresponding to the display area are in a disconnected state at a position of the non-display area between the block area and the display area, so that the anode layer forms an anode corresponding to the display area and an anode material layer corresponding to the block area.

In the organic light-emitting diode display panel of the present disclosure, the anode material layer is formed in the groves located at two lateral sides of the blocks, and the anode material layer at least covers the exposed portion of the signal trace.

In the organic light-emitting diode display panel of the present disclosure, the grooves are ring shapes surrounding the display area, and the anode material layer covers an upper surface and a side surface of the signal trace.

In the organic light-emitting diode display panel of the present disclosure, the anode material layer is formed on a bottom and side wall of the grooves.

In the organic light-emitting diode display panel of the present disclosure, the anode material layer forms a continuous film in the block area, and the anode material layer extends from a boundary of the block area near a side of the display area to a boundary of the block area away from the display area.

In the organic light-emitting diode display panel of the present disclosure, a boundary of the anode material layer is located in the non-display display area adjacent to a side of the block area away from the display area, and an orthographic projection of the thin film encapsulation layer located on the organic light-emitting diode display panel covers an orthographic projection of the anode material layer located on the organic light-emitting diode display panel.

In the organic light-emitting diode display panel of the present disclosure, the signal trace includes a source/drain pole and the signal trace disposed on the same layer as the source/drain pole, and the material of the signal trace is the same as the material of the source/drain pole.

Beneficial Effects

The beneficial effects of the present disclosure are that in the OLED display panel provided in the present disclosure, when the block is disposed on the OLED display panel, only a portion of the organic film layer above the signal trace adjacent two lateral sides of the block is excavated, so that the signal trace in the block area is not exposed. Therefore, it is possible to prevent erroneous etching of the signal trace caused by the etching solution when the electrode layer is being etched. Alternatively, when the anode is formed from the anode layer, an anode material layer is formed in the corresponding block area to at least cover the exposed signal trace. The signal trace is covered by the anode material layer to prevent the etching solution from mis-etching the signal trace, thereby ensuring the encapsulation effect of the OLED display panel.

DESCRIPTION OF DRAWINGS

The specific implementation of the present disclosure will be described in detail with reference to the following drawings, which will make the technical solution and other beneficial effects of the present disclosure obvious.

DETAILED DESCRIPTION OF PREFERRED EMBODIMENTS

The following descriptions of the embodiments are with reference to additional drawings to illustrate specific embodiments that can be implemented by the present disclosure. Directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

The present disclosure focuses on the existing organic light-emitting diode (OLED) display panel. The technical problem that the etching solution caused mis-etching on the bare signal traces when preparing the anode. The embodiment can solve the defect.

Figure 1:
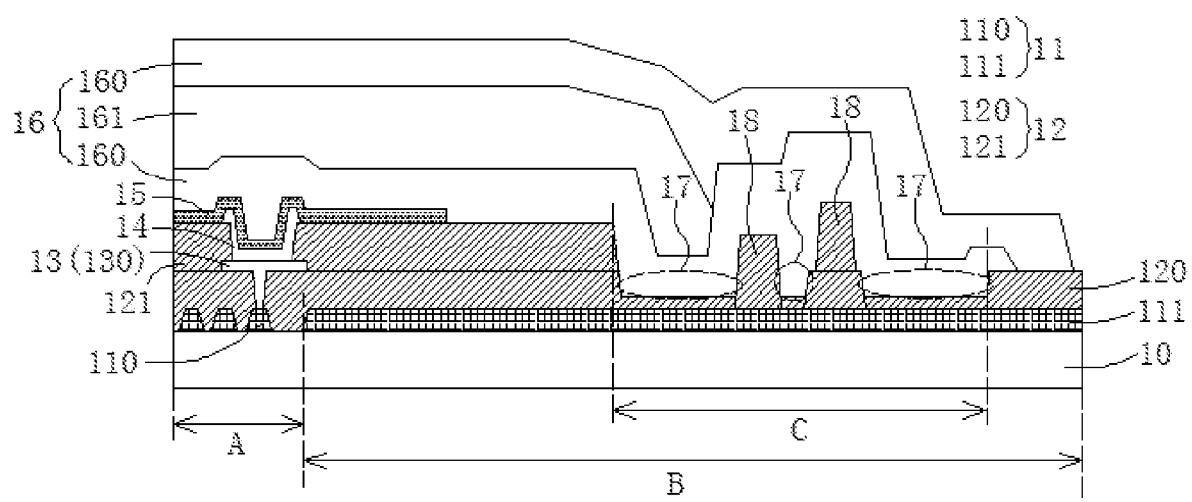
FIG. 1 is a schematic view of a partial structure of an organic light-emitting diode display panel according to a first embodiment of the present disclosure.

Referring to FIG. 1, a schematic view of a partial structure of an organic light-emitting diode display panel according to a first embodiment of the present disclosure is illustrated. The OLED display panel includes display area A, a non-display area B, and a block area C proved in the non-display area. The OLED display panel includes a base substrate 10, a signal trace layer 11 formed on the base substrate 10, an organic film layer 12 formed on the signal trace layer 11, an anode layer 13 formed in the organic film layer, an organic light-emitting layer 14, a cathode layer 15, and a thin film encapsulation layer 16, wherein the base substrate 10 is an array substrate or a glass substrate. The material of the signal trace layer 11 includes a titanium film layer, an aluminum film layer, and a titanium film layer, which are stacked, namely Ti/Al/Ti composite metal layer. The signal trace layer 11 includes a pixel circuit corresponding to the display area A and a signal trace 111 corresponding to the non-display area B. The pixel circuit includes a source/drain 110 on the same layer as the signal trace 111. The material of the signal trace 111 is the same as that of the source/drain 110. The organic film layer 12 includes, but is not limited to, a planarization layer 120, a pixel definition layer 121, and a spacer layer (not shown).

In the embodiment, the anode layer 13 is an anode 130 corresponding to the display area A. In the display area A, the anode 130 formed on the planarization layer 120 is electrically connected to the source/drain 110 through a hole. The organic light-emitting layer 14 is formed on the anode 130, and the cathode layer 15 is formed on the organic light-emitting layer 14.

In the embodiment, the block area C is at least provided with a block 18 and grooves 17 located at opposite sides of the block 18. The block 18 is formed by patterning the organic film layer 12. In the patterning process, a portion of the organic film layer 12 adjacent two lateral sides of a position corresponding to the block 18 to be formed is removed. The grooves 17 are formed at the positions of the removed organic film layer 12. A space between the block 18 and the organic film layer 12 outside the block area C is formed by grooves 17. If the block 18 are formed, a space between adjacent two blocks 18 is formed by grooves.

The signal trace 111 passes through the block area C and extend to the non-display area B located at opposite sides of the block area C. A portion of the organic film layer 12 is still reserved at a position corresponding to the grooves 17. Therefore, the signal trace 111 is not exposed, and the surface of the signal trace 111 is covered by the organic film layer 12. When the anode layer 13 is etched, the etching solution does not contact the signal trace 111 and does not cause mis-etching of the signal trace 111.

The thin film encapsulation layer 16 includes an inorganic encapsulation layer 160 and an organic encapsulation layer 161 that are stacked. A boundary of the organic encapsulation layer 161 abuts against the block area C, and a boundary of the inorganic encapsulation layer 160 is located in the non-display area B adjacent a side of the block area C away from the display area A. The block 18 is used to block the organic encapsulation layer 161 so that the organic encapsulation layer 161 abuts against the block area C. In order to ensure the reliability of the block 18 blocking the organic encapsulation layer 161, the height of at least two of the blocks 18 gradually increase from the side closer to the display area A to the side farther from the display area A. Furthermore, the depth of the grooves is also adjusted, so that the thickness of the organic film layer 12 remaining on the bottom of the grooves 17 is reduced as much as possible. At least the remaining organic film layer 12 can cover the surface of the signal trace 111 without being etched by the etching solution.

In the embodiment, the grooves 17 pass through the pixel definition layer 121 and a portion of the planarization layer 120, but is not limited thereto.

In the embodiment, an inorganic film layer (not shown) is further provided between the signal trace layer 11 and the organic film layer 12, and the grooves 17 pass through the inorganic film layer and the organic film layer 12 partially or completely.

Figure 2:
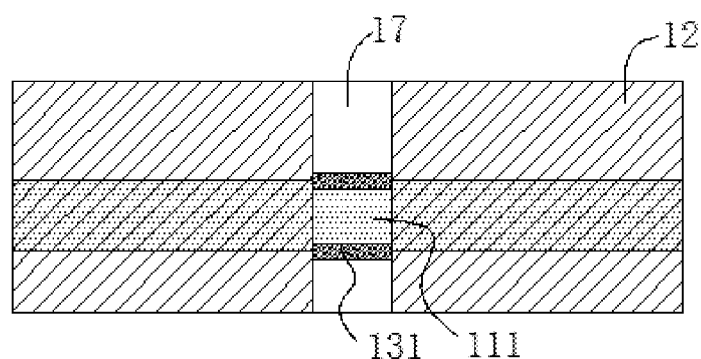
FIG. 2 is a schematic view of a partial structure of an organic light-emitting diode display panel according to a second embodiment of the present disclosure.
Figure 3:
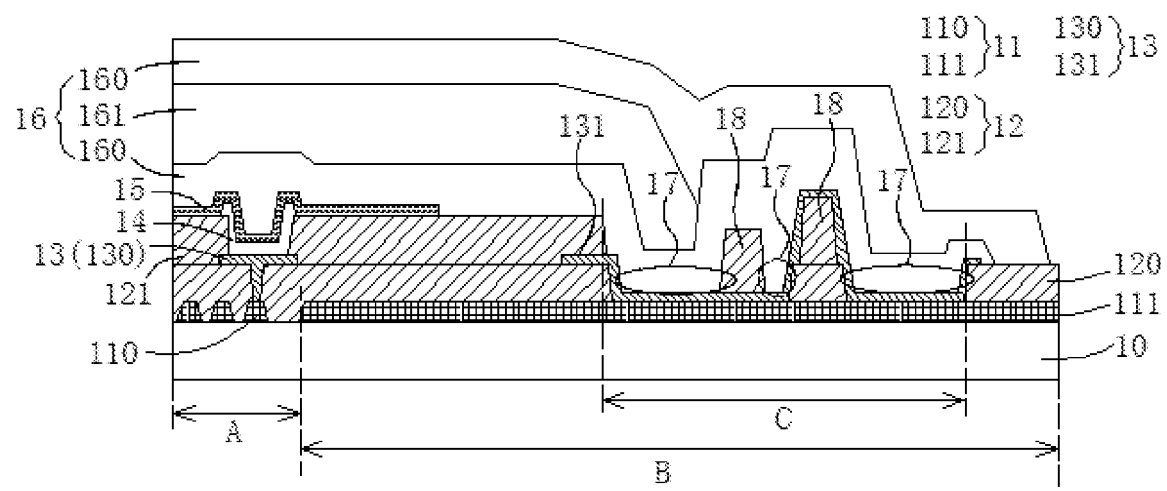
FIG. 3 is a schematic view of a partial structure of another organic light-emitting diode display panel according to the second embodiment of the present disclosure.

Referring to FIG. 2 and FIG. 3, a schematic view of a partial structure of an organic light-emitting diode display panel according to a second embodiment of the present disclosure is illustrated. Compared with the above embodiment, the difference in the embodiment is that the grooves 17 all pass through the organic film layer 12. After the block 18 is formed, the signal trace 11 is exposed to the organic film layer 12 in the grooves 17 adjacent two lateral sides of the block 18. When the anode layer 13 is disposed on the planarization layer 120, the surface of the anode material is formed in the display A and the non-display area B. After the anode layer 13 is patterned, an anode material layer 131 is formed. The anode mater layer 131 corresponds to the anode 130 of the display area A and is insulated from the anode 130, and the exposed anode material layer 131 covers the side of the signal trace 111. At least the side surface of the signal trace 111 that is exposed is covered by the anode material layer 131. Therefore, the etching solution of the anode layer 13 is prevented from contacting the aluminum film layer in the signal trace 111.

Referring to FIG. 2, the exposed side surface and the upper surface of the signal trace 111 are covered by the anode material layer 131. As a result, the etching solution of the anode layer 13 is prevented from contacting the aluminum film layer in the signal trace 111, thereby reducing the false etching of the aluminum film layer by the etching solution.

Referring to FIG. 3, a schematic view of a partial structure of another organic light-emitting diode display panel according to the second embodiment of the present disclosure is illustrated. In order to ensure the reliability of the anode material layer 131, the signal trace 111 is provided with the anode material layer 131 on all surfaces exposed by the grooves 17. The portion of the anode layer 13 corresponding to the block area C and the portion of the anode layer 13 corresponding to the display area A are in a disconnected state in the non-display area B between the block area C and the display area A. So that the anode 130 formed in the display area A and the anode material layer 131 corresponding to the block area C are insulated from each other.

It can be understood that the role of the anode material layer 131 is different from that of the anode 130. The anode 130 is used as a pixel electrode, and the anode material layer 131 is used to isolate the etching solution from the aluminum material in the signal trace 111. The andoe material is a conventional material generally used for disposing pixel electrodes, such as indium tin oxide, indium zinc, and the like.

In one embodiment, the anode material layer 131 is spaced in the grooves 17 adjacent two lateral sides of the block 18, and the anode material layer 131 covers at least the exposed signal trace 111. As a result, the etching solution on the anode layer does not contact the signal trace 111, and the aluminum material of the signal trace is not etched. Specifically, the grooves 17 have ring shapes surrounding the display area, and the anode material layer 131 at least covers an upper surface and a side surface of the signal trace 111. Further, in a width direction of the signal trace 111, the boundary of the anode material layer 131 at least exceeds the boundary of the signal trace 111 by 1 µm. In a length direction of the signal trace 111, the boundary of the anode material layer 131 at least exceeds the length of the exposed signal trace 111 by 1 µm.

In one embodiment, the anode material layer 131 is formed on the bottom and sidewall of the grooves 17. That is, the anode material layer 131 is formed on the entire surface of the grooves 17, thereby further preventing the etching solution from contacting the aluminum film layer of the signal trace 111.

In one embodiment, the anode material layer 131 forms a continuous thin film in the block area C, and the anode material layer 131 at least extends from the boundary of the block area C near the display area A to the boundary of the block area C away from the display area A. Since the anode material layer 131 covers the entire block area C, the etching solution is further prevented from contacting the aluminum film layer of the signal trace 111.

In one embodiment, the boundary of the anode material layer 131 away from the display area A is located in the non-display area B adjacent to a side of the block area C away from the display area A. An orthographic projection of the thin film encapsulation layer 16 located on the organic light-emitting diode display panel covers an orthographic projection of the anode material layer 131 located on the organic light-emitting diode display panel. That is, the anode material layer 131 is covered by the thin film encapsulation layer 16, thereby enhancing the encapsulation effect.

The OLED display panel is provided in the present disclosure, when the block is disposed on the OLED display panel, only a portion of the organic film layer above the signal trace adjacent two lateral sides of the block is excavated, so that the signal trace in the block area is not exposed. Therefore, it is possible to prevent erroneous etching of the signal trace caused by the etching solution when the electrode layer is being etched. Alternatively, when the anode is formed from the anode layer, an anode material layer is formed in the corresponding block area to at least cover the exposed signal trace. The signal trace is covered by the anode material layer to prevent the etching solution from mis-etching the signal trace, thereby ensuring the encapsulation effect of the OLED display panel.

In summary, although the present application has been disclosed above with preferred embodiments, the above preferred embodiments are not intended to limit the present application. Those skilled in the art can make various modifications without departing from the spirit and scope of the present application. This modification and retouching, therefore, the scope of protection of this application shall be based on the scope defined by the claims.

What is claimed is:

1. An organic light-emitting diode display panel comprising a display area, a non-display area located around the display area, and a block area provided in the non-display area, wherein the organic light-emitting diode display panel comprises:
    a signal trace layer, an organic film layer formed on the signal trace layer, and an anode layer formed on the organic film layer;
    wherein the signal trace layer is provided with a signal trace in the non-display area, and the signal trace passes through the block area and extends to the non-display area located at opposite sides of the block area;
    wherein a portion of the organic film layer corresponding to the block area is patterned to form at least one block, and a space between adjacent two blocks and a space between the block and the organic film layer outside the block area are formed by grooves;
    wherein the grooves pass through the organic film layer partially or completely, and the anode layer is at least formed on a side of an exposed portion of the signal trace corresponding to the grooves when all the grooves pass through the organic film layer;
    wherein two sides of a surface of the signal trace located in a groove exposes the organic film layer and the anode material layer covers the two sides of a surface of the signal trace.

2. The organic light-emitting diode display panel according to claim 1, wherein the organic light-emitting diode display panel further comprises a organic light-emitting layer formed on the anode layer, a cathode layer, and a thin film encapsulation layer; the thin film encapsulation layer includes an inorganic encapsulation layer and an organic encapsulation layer that are stacked; a boundary of the organic encapsulation layer abuts against the block area; and a boundary of the inorganic encapsulation layer is located in the non-display display area adjacent to a side of the block area away from the display area.

3. The organic light-emitting diode display panel according to claim 1, wherein the block area includes the blocks and the grooves located at two lateral sides of blocks; a portion of the anode layer corresponding to the block area and a portion of the anode layer corresponding to the display area are in a disconnected state at a position of the non-display area between the block area and the display area, so that the anode layer forms an anode corresponding to the display area and an anode material layer corresponding to the block area.

4. The organic light-emitting diode display panel according to claim 3, wherein the anode material layer is formed in the groves located at two lateral sides of the blocks, and the anode material layer at least covers the exposed portion of the signal trace.

5. The organic light-emitting diode display panel according to claim 4, wherein the grooves are ring shapes surrounding the display area, and the anode material layer covers an upper surface and a side surface of the signal trace.

6. The organic light-emitting diode display panel according to claim 4, wherein the anode material layer is formed on a bottom and side wall of the grooves.

7. The organic light-emitting diode display panel according to claim 3, wherein the anode material layer forms a continuous film in the block area, and the anode material layer extends from a boundary of the block area near a side of the display area to a boundary of the block area away from the display area.

8. The organic light-emitting diode display panel according to claim 3, wherein a boundary of the anode material layer is located in the non-display display area adjacent to a side of the block area away from the display area, and an orthographic projection of the thin film encapsulation layer located on the organic light-emitting diode display panel covers an orthographic projection of the anode material layer located on the organic light-emitting diode display panel.

9. The organic light-emitting diode display panel according to claim 1, wherein the signal trace includes a source/drain pole and the signal trace disposed on the same layer as the source/drain pole, and the material of the signal trace is the same as the material of the source/drain pole.

10. An organic light-emitting diode display panel comprising a display area and a non-display area located around the display area, and a block area provided in the non-display area, wherein the organic light-emitting diode display panel comprises:
    a signal trace layer, an inorganic film layer formed on the signal trace layer, an organic film layer formed on the inorganic film layer, and an anode layer formed on the organic film layer;
    wherein the signal trace layer is provided with a signal trace in the non-display area, and the signal trace passes through the block area and extends to the non-display area located at opposite sides of the block area;
    wherein a portion of the organic film layer corresponding to the block area is patterned to form at least one block, and a space between adjacent two blocks and a space between the block and the organic film layer outside the block area are formed by grooves;
    wherein the grooves pass through the organic film layer and the inorganic film layer partially or completely, and the anode layer is formed on a side of an exposed portion of the signal trace corresponding to the grooves when all the grooves pass through the organic film layer;

wherein two sides of a surface of the signal trace located in a groove exposes the organic film layer and the anode material layer covers the two sides of a surface of the signal trace.

11. The organic light-emitting diode display panel according to claim 10, wherein the organic light-emitting diode display panel further comprises a organic light-emitting layer formed on the anode layer, a cathode layer, and a thin film encapsulation layer; the thin film encapsulation layer includes an inorganic encapsulation layer and an organic encapsulation layer that are stacked; a boundary of the organic encapsulation layer abuts against the block area; and a boundary of the inorganic encapsulation layer is located in the non-display display area adjacent to a side of the block area away from the display area.

12. The organic light-emitting diode display panel according to claim 10, wherein the block area includes the blocks and the grooves located at two lateral sides of blocks; a portion of the anode layer corresponding to the block area and a portion of the anode layer corresponding to the display area are in a disconnected state at a position of the non-display area between the block area and the display area, so that the anode layer forms an anode corresponding to the display area and an anode material layer corresponding to the block area.

13. The organic light-emitting diode display panel according to claim 12, wherein the anode material layer is formed in the groves located at two lateral sides of the blocks, and the anode material layer at least covers the exposed portion of the signal trace.

14. The organic light-emitting diode display panel according to claim 13, wherein the grooves are ring shapes surrounding the display area, and the anode material layer covers an upper surface and a side surface of the signal trace.

15. The organic light-emitting diode display panel according to claim 13, wherein the anode material layer is formed on a bottom and side wall of the grooves.

16. The organic light-emitting diode display panel according to claim 12, wherein the anode material layer forms a continuous film in the block area, and the anode material layer extends from a boundary of the block area near a side of the display area to a boundary of the block area away from the display area.

17. The organic light-emitting diode display panel according to claim 12, wherein a boundary of the anode material layer is located in the non-display display area adjacent to a side of the block area away from the display area, and an orthographic projection of the thin film encapsulation layer located on the organic light-emitting diode display panel covers an orthographic projection of the anode material layer located on the organic light-emitting diode display panel.

18. The organic light-emitting diode display panel according to claim 10, wherein the signal trace includes a source/drain pole and the signal trace disposed on the same layer as the source/drain pole, and the material of the signal trace is the same as the material of the source/drain pole.

* * * * *